United States Patent [19]

Simmers et al.

[11] Patent Number: 5,432,523
[45] Date of Patent: Jul. 11, 1995

[54] ELLIPTICAL NEAR FIELD TEST FACILITY

[75] Inventors: Jeffrey Simmers, Hanscom AFB; Peter R. Franchi, Winchester; Harvey E. Tobin, Draut, all of Mass.

[73] Assignee: The United States of America as represented by the Secretary of the Air Force, Washington, D.C.

[21] Appl. No.: 112,813

[22] Filed: Aug. 20, 1993

[51] Int. Cl.[6] .................... H01Q 3/00; G01R 29/10
[52] U.S. Cl. ................................. 343/703; 342/360
[58] Field of Search ............... 343/703; 342/360, 165, 342/354

[56] References Cited

U.S. PATENT DOCUMENTS

| | | | |
|---|---|---|---|
| 4,201,987 | 5/1980 | Tricoles et al. | 343/703 |
| 4,218,683 | 8/1980 | Hemming | 343/703 |
| 4,704,614 | 11/1987 | Poirier et al. | 343/703 |
| 4,811,023 | 3/1989 | Gelernter et al. | 343/703 |
| 4,998,112 | 3/1991 | Franchi et al. | 342/360 |
| 5,001,494 | 3/1991 | Dorman et al. | 343/703 |
| 5,204,685 | 4/1993 | Franchi et al. | 342/360 |

FOREIGN PATENT DOCUMENTS 1532888  12/1989  U.S.S.R. ........................ 343/703

Primary Examiner—Donald Hajec
Assistant Examiner—Tan Ho
Attorney, Agent, or Firm—William G. Auton; Jacob N. Erlich

[57] ABSTRACT

In order to measure the far field antenna pattern of a phased array antenna, the phased array is focused at a probe antenna which is a specific distance away from the aperture. The antenna pattern is then measured by moving the probe antenna on an elliptical arc about the antenna under test.

4 Claims, 3 Drawing Sheets

ELLIPTICAL NEAR FIELD TEST FACILITY

STATEMENT OF GOVERNMENT INTEREST

The invention described herein may be manufactured and used by or for the Government for governmental purposes without the payment of any royalty thereon.

BACKGROUND OF THE INVENTION

The present invention relates generally to radar antennas, and more specifically the invention pertains to a process for measuring the antenna pattern of a phased array antenna.

Traditional antenna measurements use $2D^2/\lambda$ as a criteria for measuring an antenna under test (AUT) in the far field, where R is the distance from the AUT to a point in space, D is the aperture size of the AUT, and $\lambda$ is the operating wavelength. Problems arise when D becomes large, which increases the distance R, therefore more real estate is needed to measure the far field antenna pattern.

The requirements of the modern radars have led to the development of phased-array antennas that continue to grow in size, with current antenna lengths of at least 30 wavelengths. This can present a major problem in taking antenna pattern measurements, because of the requirement to measure these patterns in the antenna's far field. Consider a C-band antenna that measures 10 feet by 100 feet. Using the standard far field criteria of $$\frac{2D^2}{\lambda}$$

where D is the aperture size, and $\lambda$ is the operating wavelength, the far field measurements would have to be taken at a distance of 23 miles from the antenna.

Fortunately, techniques have been developed to measure the far field pattern of the antenna under test on smaller indoor ranges. Advantages of using these ranges include: reduction of outside interference, reduction of testing time lost to poor weather conditions, the ability to do classified testing, and the reduction of electromagnetic transmissions into the environment. This last point is especially important with the current interest in environmental impact analysis. Unfortunately, there are still problems with these techniques. For example, the transformation of data collected by near field probing into the far field requires many sample points. Another problem is that a large reflector with a high surface tolerance restricts the use of a compact range.

Development over the years has led to techniques to measure the far field pattern of the AUT on smaller ranges. Using a small range reduces outside interference, eliminates testing time due to poor weather conditions, and provides the option of doing classified testing. Many of the previous smaller range techniques eliminate or lessen these problems. There are however, other problems with these techniques. For example, transformation from near field probing to the far field requires many sample points, the large size and high surface tolerance requirements of a reflector restricts the use of a compact range.

The task of reducing the range requirements while measuring the far field antenna patterns of large antenna arrays is alleviated, to some extent, by the systems disclosed in the following U.S. Pat. Nos., the disclosures of which are incorporated herein by reference:

U.S. Pat. No. 5,204,685 issued to Franchi et al;
U.S. Pat. No. 5,001,494 issued to Dorman et al;
U.S. Pat. No. 4,998,112 issued to Franchi et al;
U.S. Pat. No. 4,811,023 issued to Gelernter et al; and
U.S. Pat. No. 4,704,614 issued to Poirer et al.

The patents of Franchi et al. disclose a method for measuring the far field antenna on a conventional far field range by applying a correction factor to the antenna. The Poirer et al. patent discloses measuring the near-field radiation by attaching a field sensing probe to a pendulum bob and mounting the antenna under a Foucalt pendulum. The entire antenna aperture can be scanned without moving the antenna. The motion of the probe covers part of an external sphere centered at the pivot point of the pendulum and having a radius equal to the length of the pendulum. Appropriate transformation of the measured near-field data gives the far-field radiation pattern. The remaining patents are of similar interest.

While the above-cited references are instructive, the need remains to measure the far field patterns of phased array antennas in a manner that reduces the range requirements. The present invention is intended to satisfy that need.

SUMMARY OF THE INVENTION

The present invention includes a process for measuring a phased array's far field antenna pattern which is exhibited by a beam emitted by the antenna. In one embodiment of the invention this process is accomplished in four steps and can greatly reduce the range requirements at which a probe antenna must be placed in order to measure far field phenomena. When a radar beam is emitted by an antenna, its exhibits different phenomena at near field and far field locations. At far field locations, the main beam of the antenna pattern is clearly distinguishable from sidelobe phenomena. At near field locations, the antenna pattern is merely a blob of electromagnetic energy in which the main beam is not so easily distinguished from the sidelobes. In order to measure far field antenna patterns, a probe antenna must be placed perhaps several kilometers from the antenna face. This is inconvenient for testing an antenna under laboratory conditions.

In the present invention, the first step of the process includes focusing the beam onto a probe antenna which measures the beam, the probe antenna being positioned at a distance R.

The second step of the process entails measuring the beam with the probe antenna.

The third step of the process entails moving the probe antenna to different positions that are on an elliptical arc of the phased array antenna.

The fourth step of the process entails repeating the focusing, measuring and moving steps.

In the present invention, the moving step is accomplished by repositioning the probe antenna along different positions along a curve given by $R \cos^2\Theta$ where $\Theta$ is an angle from broadside to the probe antenna, and is the focal arc of the phased array antenna. As discussed below, the probe is positioned along the elliptical arc.

It is an object of the present invention to allow the testing of antenna pattern far field phenomena at up to nearly 1/10 of the distances normally used.

It is another object of the present invention to minimize phase aberrations due to a defocusing error.

These together with other objects, features and advantages of the invention will become more readily apparent from the following detailed description when taken in conjunction with the accompanying drawings wherein like elements are given like reference numerals throughout.

DETAILED DESCRIPTION OF THE PREFERRED EMBODIMENT

The present invention includes a process and a test facility measuring the far field antenna pattern of a phased array antenna. The phased array is focused at a probe antenna which is a specific distance away from the aperture. The antenna pattern is then measured by moving the probe antenna on an elliptical focal arc. This arc minimizes phase aberrations due to defocusing error.

In the preferred embodiment, the antenna under test will focus its output at a near field point to reduce the far field distance. At this near field point a test probe is placed on an arm that rotates on a 100 degree elliptical path. The test probe is also matched to compensate for amplitude variation. This technique will permit very practical near field antenna ranges to measure large aperture antennas in an environment.

Figure 1:
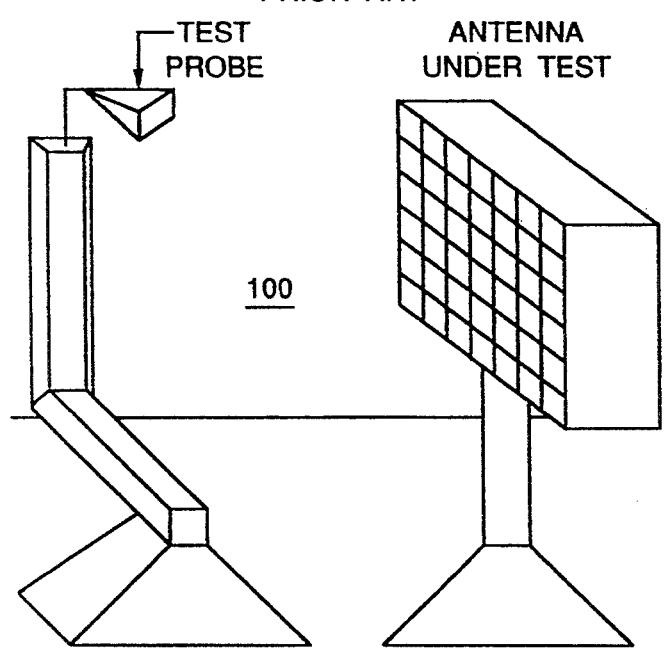
FIG. 1 is an illustration of the prior art elements of an arc range test facility.

FIG. 1 is an illustration of the prior art arc range test elements used in U.S. Pat. No. 5,204,685 as well as by the process of the present invention. In FIG. 1, the emissions of the antenna under test are focused on the probe antenna, which measures them. Subsequent measurements are made as the probe antenna is moved to different positions on an elliptical are about the antenna under test. The present invention is a test facility that differs from FIG. 1 in that the antenna under test and test probe are placed in an anechoic chamber 100 while the test probe is moved in an elliptical path for successive measurements.

Figure 2:
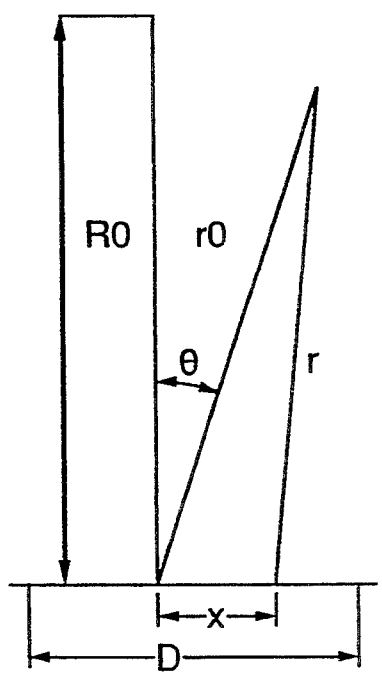
FIG. 2 is an illustration of the antenna testing geometry used in the present invention.

The approach taken in this invention is to focus the array at a near field point to reduce the far field distance. At this near field point a test probe is placed on an arm that rotates on a 100° elliptical path. The test probe is also matched to compensate for the amplitude variation. FIG. 2 represents the geometry used in determining the field pattern.

The electric field pattern in general is given by $$E(\theta) = C \int_{-D/2}^{D/2} f(x) G(x,\theta) \frac{\exp^{jkr(x,\theta)}}{r(x,\theta)} dx \quad (1)$$

where C is a constant, f(x) is the aperture distribution, $G(x, \Theta)$ is the pattern of the probe antenna, and $r(x, \Theta)$ is the distance from an arbitrary point on the test array to the probe antenna. Adding in quadratic focusing, Equation 1 becomes $$E(\theta) = C \int_{-D/2}^{D/2} f(x) G(x,\theta) \frac{\exp^{jk(-\frac{x^2}{2r_0} + r(x,\theta))}}{r(x,\theta)} dx \quad (2)$$

Expanding the phase term in Equation 2 gives $$k \left( r(x,\theta) - \frac{x^2}{2r_0} \right) = k \left( r_0 + x \sin\theta + \left( \frac{x^2 \cos^2\theta}{2r_0} - \frac{x^2}{2R_0} \right) - \frac{x^3 \sin\theta \cos^2\theta}{2r_0^2} + \cdots \right) \quad (3)$$

and the quadratic term is $$\frac{x^2}{2} \left( \frac{\cos^2\theta}{r_0} - \frac{1}{R_0} \right). \quad (4)$$

Thus if $r_o = R_o \cos^2\Theta$ the quadratic term goes to zero.

Eliminating the quadratic term allows the cubic term to grow to $\lambda/16$, which would occur at a much smaller range. Thus, the method of eliminating the quadratic error term involves focusing the antenna test at some distance R, then moving the probe antenna along a path given by $r_o = R_o \cos^2\Theta$. An antenna pattern can be measured by scanning the array over the 100° angular sector. Unfortunately, it is difficult to construct general purpose hardware that can produce the focal arc defined by $R_o \cos^2\Theta$ for different values of $R_o$. Therefore, it is advantageous to find a better approximation to $R_o \cos^2\Theta$.

Figure 3:
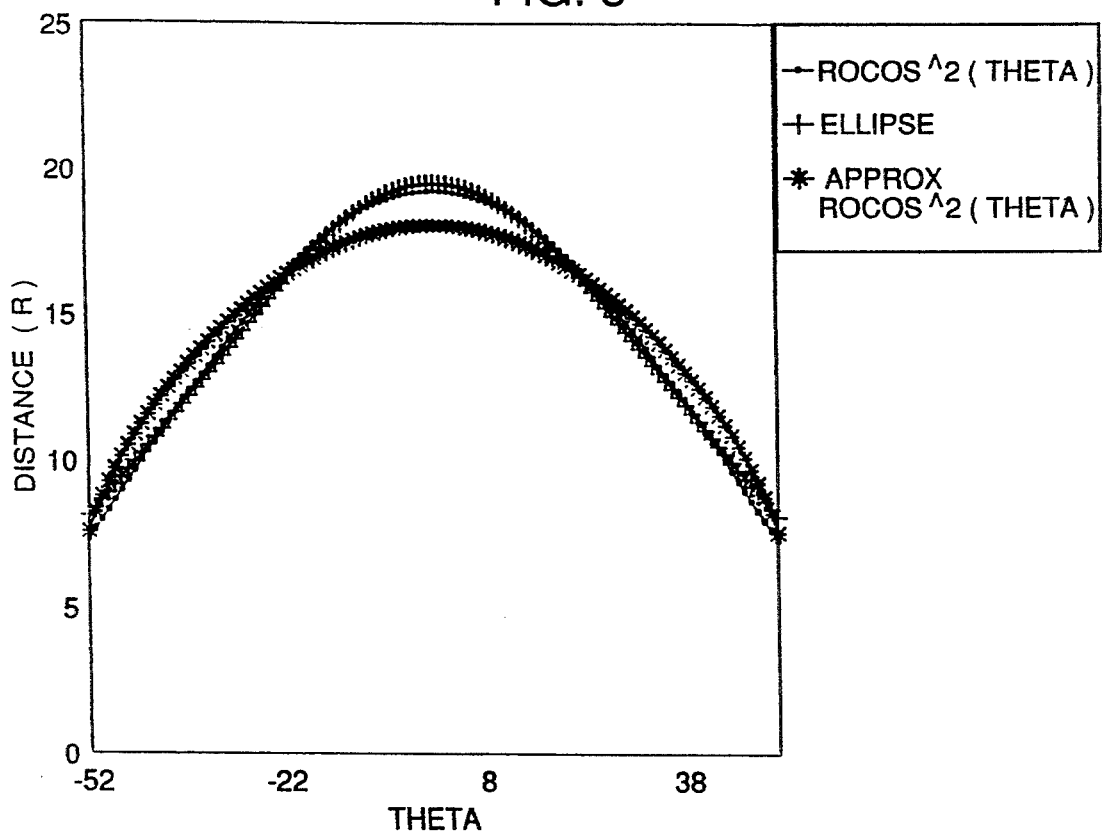
FIG. 3 is a chart of a geometric comparison of distance R and theta for elliptical placements of the test probe about the antenna under test.

Such an approximation is an elliptical curve given by $$\frac{x^2}{b^2} + \frac{(y-a)^2}{a^2} = 1 \quad (5)$$

where a is the half-axis length along the boresight line (the y axis) of the antenna under test, and b is the half-axis length perpendicular to the boresight line (along the x axis). This means that the test probe initially (i.e. the off boresight angle is zero) lies along the y axis at a distance 2a from the antenna. As the test probe is moved an angle $\Theta$ off boresight along-the ellipse, the parametric representation of the ellipse becomes $$\frac{r_0^2 \sin^2\theta}{b^2} + \frac{r_0^2 \cos^2\theta}{a^2} - \frac{2r_0 \cos\theta}{a} = 0 \quad (6)$$

with $r_o \cos \Theta = y$ and $r_o \sin \Theta = x$. Since the test probe will not be a radial distance of zero from the center of the array (the distance $r_o$), division by $r_o$ and rearranging yields $$r_0 = \frac{2\cos\theta}{a[(\sin^2\theta)/b^2 + (\cos^2\theta)/a^2]} \quad (7)$$

where the parameters a and b determine the shape of the ellipse. Note that scientific graphics software can be used to experiment with different values of a and b so as to tailor the ellipse to more closely approximate $R_o \cos^2 \Theta$. FIG. 3 compares the arc given by $R_o \cos^2 \Theta$ with one ellipse whose parameters are a =0.507 and b =0.38. With respect to the derivation of the ellipse the y axis is horizontal and the x axis is vertical in this figure. The orientation of the plot has the antenna under test situated on the horizontal axis at a distance of 1.0 from and parallel to the vertical axis. Thus the antenna is located at the zero point on the horizontal axis, the boresight of the antenna lies along the horizontal axis, and $R_o = 1$.

Using the elliptical arc approximation generates a residual error with respect to the focal arc given by $R_o \cos^2 \Theta$. To aid in analyzing this residual error, we refer to FIG. 2, where $r_o$ represents the distance from the center of the array being tested to a point on the focal arc, and $R_o$ represents the distance from the center of the array being tested to the phase center. Therefore, only the changes in these path lengths to various points on the tested array caused by using the elliptical curve instead of the focal arc will effect the antenna pattern, and the maximum error will occur at the edges.

To analyze the maximum error at the edges we refer to FIG. 2, where 1 is the distance from a point on the focus arc to one edge of the test antenna, and 1 is the distance from a corresponding point (same angle) on the same edge of the antenna. From the law of cosines $$l^2 = (D/2)^2 + r_0^2 + Dr_0 \sin \theta \qquad (8)$$

$$\dot{l}^2 = (D/2)^2 + \dot{r}_0^2 + D\dot{r}_0 \sin \theta \qquad (9)$$

The edge of the array at $x = D/2$ would have a phase relative to that at the center of $$\psi = \frac{-KD^2}{8R_0} \qquad (10)$$

This phase shift focuses the array at $R_o$. At $\Theta = O$, $\Psi_o$ gives the phase, where $$\psi_0 = \frac{2\pi}{\lambda}(l - r_0)$$

$$= \frac{2\pi}{\lambda}[(D^2/2 + R_0^2)^{\frac{1}{2}} - R_o]$$

and for $R_0 >> D/2$ $$= \frac{2\pi}{\lambda} \frac{D^2}{8R_0}$$

The phase error $\delta$ at the edge of the antenna due to the elliptical path is $$\delta = K(\dot{l} - \dot{r}_0) - \psi_0 \qquad (12)$$

$$= \frac{2\pi}{\lambda}[(\dot{r}_0^2 + D^2/4 + \dot{r}_0 D \sin \theta)^{1/2} - \dot{r}_0] - \frac{\pi D^2}{4\lambda R_0}$$

and after expanding for $\dot{r}_0 >> D/2$ $$= K\left[\dot{r}_0 + \frac{D\sin\theta}{2} + \frac{D^2}{8\dot{r}_0} - \frac{D^2\sin^2\theta}{8\dot{r}_0} - \dot{r}_0\right] - \frac{\pi D^2}{4\lambda R_0}$$

$$= K\left[\frac{D\sin\theta}{2} + \frac{D^2}{8\dot{r}_0} - \frac{D^2\sin^2\theta}{8\dot{r}_0}\right] - \frac{\pi D^2}{4\lambda R_0}$$

-continued $$= K\left[\frac{D\sin\theta}{2} + \frac{D^2\cos^2\theta}{8\dot{r}_0}\right] - \frac{\pi D^2}{4\lambda R_0}$$

$$= \frac{2\pi D\sin\theta}{\lambda 2} + \frac{2\pi D^2\cos^2\theta}{\lambda 8\dot{r}_0} - \frac{\pi D^2}{4\lambda R_0}$$

where $\pi D \sin \Theta / \lambda$ is just the linear term. For a given $\Theta$ and corresponding a and b, this residual error $\delta$ becomes $$\delta = \frac{\pi D^2}{4\lambda R_0}\left[\frac{R_0 \cos^2\theta}{\frac{2\cos\theta}{a[\sin^2\theta/b^2 + \cos^2\theta/a^2]}} - 1\right] \qquad (13)$$

Figure 4:
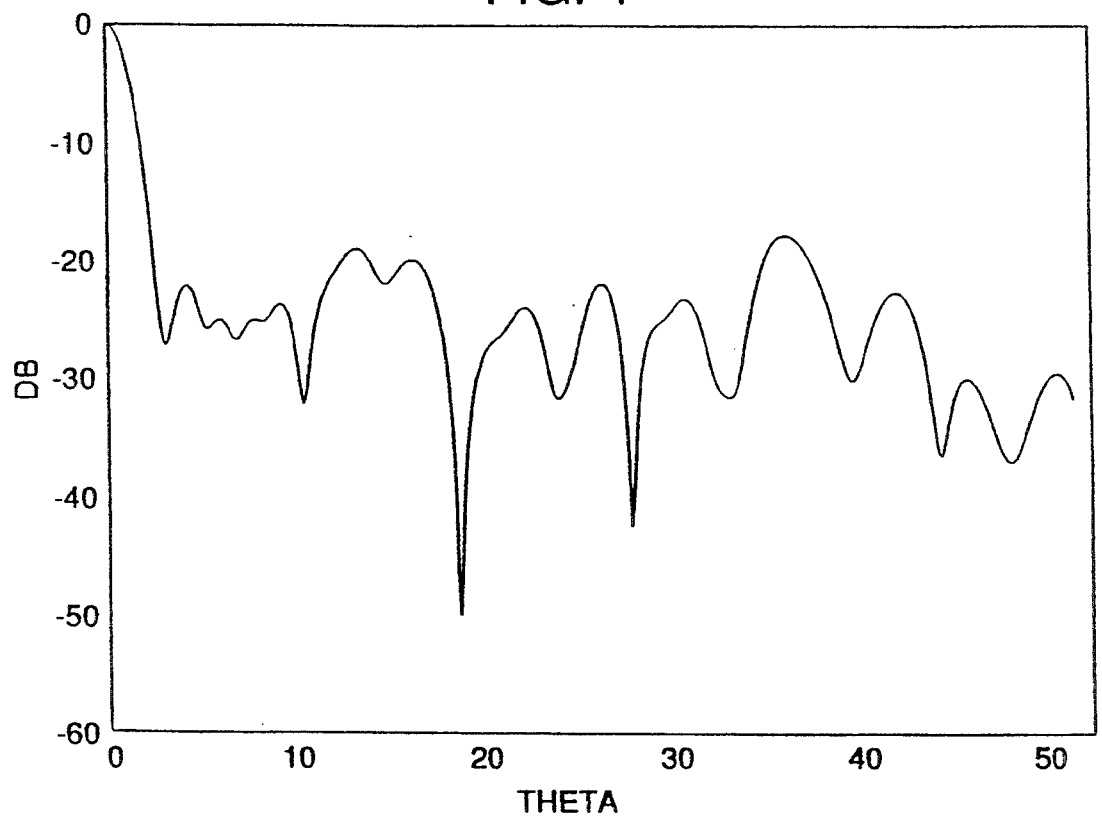
FIG. 4 is a chart of measurements of the 30 dB far field antenna pattern of an antenna under test.
Figure 5:
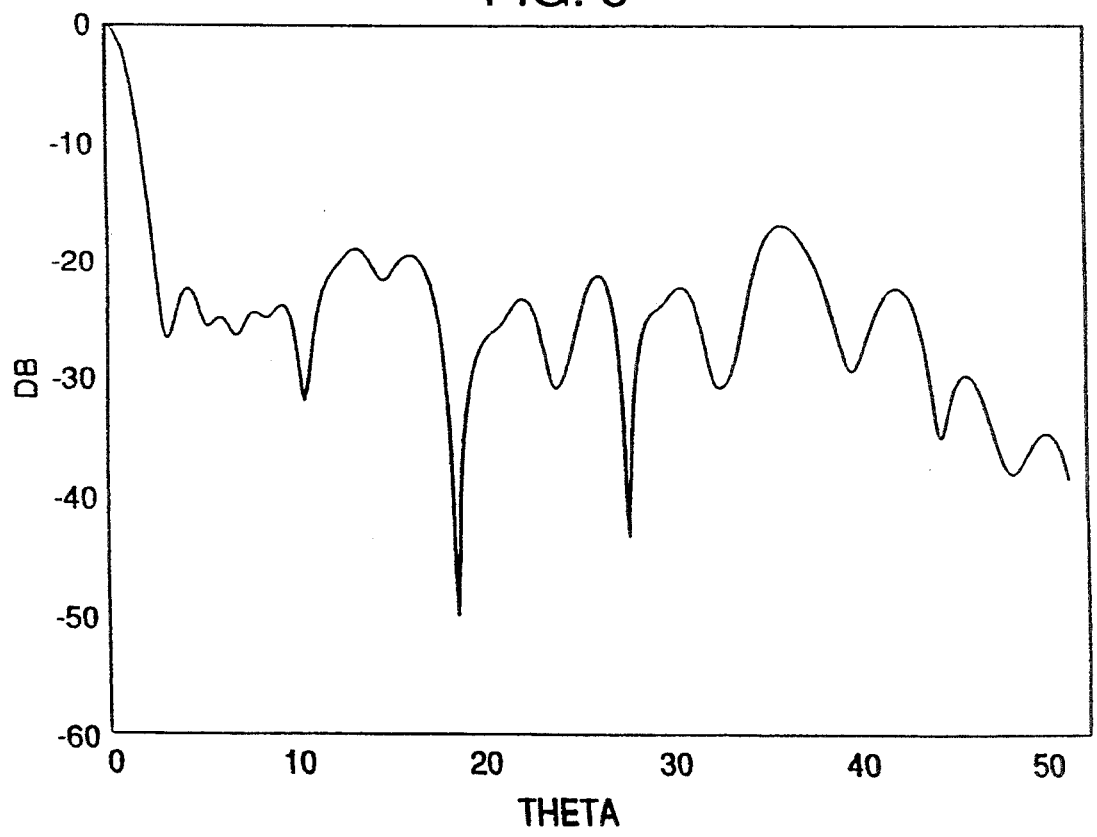
FIG. 5 is a chart of measurements made with the probe antenna placed in an ellipse pattern about the antenna under test.
Figure 6:
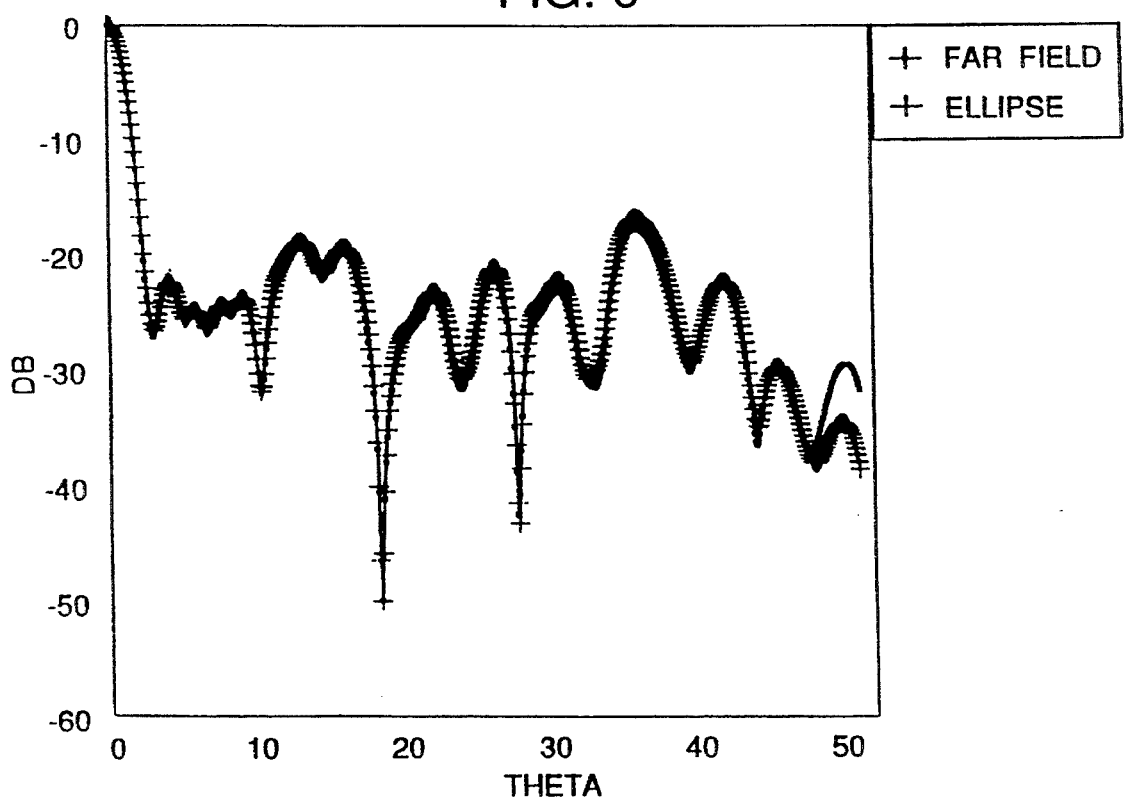
FIG. 6 is a chart of comparison between the measurements of FIGS. 4 and 5.

A computer simulation was used to validate the quality of the elliptical approximation. The simulated antenna under test is a 64 element linear array with $\lambda/2$ spacing and a 30dB Taylor amplitude taper. Random amplitude errors are applied to the Taylor coefficients to simulate real time measurements, using a pseudo-random number generator with a 0.4 error margin. FIG. 4 shows a plot of the far field performance of the antenna under test for $2D^2/\lambda$. FIG. 5 depicts the far field pattern when the probe antenna is rotated on the elliptical path. FIG. 6 shows the far field and the elliptical path patterns superimposed. The figure clearly demonstrates that the elliptical pattern matches the far field pattern extremely well.

The application of the elliptical technique has reduced the amount of residual error caused by approximating the focal arc, because the parameters of the ellipse can be set so that the ellipse more closely resembles the actual $R_o \cos^2 \Theta$ curve. Thus this technique will permit very practical near field antenna ranges to measure large aperture antennas in an enclosed environment. A major contribution of this technique is the ability to measure a wide variety of different sized antennas with the same test hardware, since the elliptical geometry can be easily changed.

Figure 7:
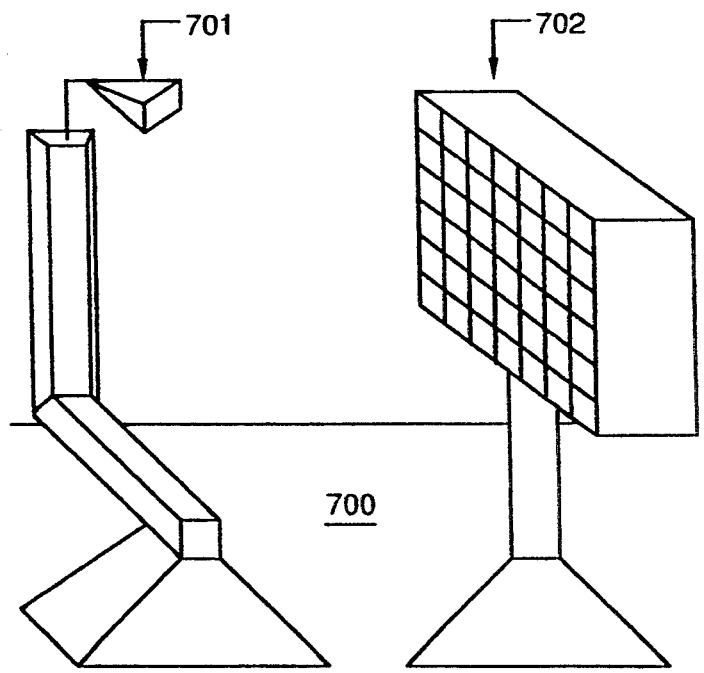
FIG. 7 is an illustration of the arc range test facility of the present invention.

FIG. 7 is an illustration of the range test facility of the present invention. In FIG. 7 the antenna probe 701 and the antenna under test 702 are placed within an anechoic chamber 700 while the probe antenna 701 is moved into different positions along an elliptical arc about the antenna under test. As discussed above, this arc is given by $R_o \cos^2 \Theta$.

An anechoic chamber is a room in which internal energy reflections are reduced to an ineffective value by lining with internally pointing pyramids of felt, foam plastic or fiberglass. The present invention might therefore be viewed as a five step process which provides two improvements over the process in the above-cited Franchi et al. patents. These two improvements include the placement of the test probe in different points along an elliptical arc about the antenna under test, as successive measurements of the antenna's radiation pattern are made. The first step of this process is the placement of the probe and the antenna inside an anechoic chamber to reduce the reflections from the walls as measurements are made.

The second step entails focusing the beam of the antenna under test onto the probe antenna, while the third step would be measuring the electromagnetic power of the beam.

The third step entails moving the probe antenna to different positions on an elliptical arc of about 10 degrees about the antenna under test, and the fourth step entails repeating the focusing, measuring and moving steps.

While the invention has been described in its presently preferred embodiment it is understood that the words which have been used are words of description rather than words of limitation and that changes within the purview of the appended claims may be made without departing from the scope and spirit of the invention in its broader aspects.

What is claimed is:

1. A process for measuring a phased array antenna's far field antenna pattern which is exhibited as electromagnetic power measured in watts per square centimeter by a beam emitted by the phased array antenna wherein said phased array antenna has an antenna center, said process comprising the steps of:

focusing the beam onto a probe antenna which measures the beam, said probe antenna being positioned at a distance R, where R is a distance between said probe antenna and the antenna center of the phased array antenna;

measuring the electromagnetic power of the beam with the probe antenna to identify a pattern of electromagnetic power emitted there from;

moving the probe antenna to different positions that are on an elliptical arc around the phased array antenna; and repeating the focusing, measuring and moving steps, wherein said moving step is accomplished by repositioning the probe antenna along different positions on a curve given by $R \cos^2 \Theta$ where $\Theta$ is an angle from broadside to the probe antenna.

2. A test facility, as defined in claim 1, wherein said probe antenna is repositioned along different positions on a curve given by $R \cos^2 \Theta$ where $\Theta$ is an angle from broadside to the probe antenna.

3. A test facility, as defined in claim 2, wherein said test probe is moved about a 10 degree elliptical path.

4. A process for measuring a phased array antenna's far field antenna pattern which is exhibited as electromagnetic power measured in watts per square centimeter by a beam emitted by the phased array antenna wherein said phased array antenna has an antenna center, said process comprising the steps of:

placing the phased array antenna in an anechoic chamber with a probe antenna;

focusing the beam onto a probe antenna which measures the beam, said probe antenna being positioned at a distance R, where R is a distance between said probe antenna and the antenna center of the phased array antenna;

measuring the electromagnetic power of the beam with the probe antenna to identify a pattern of electromagnetic power emitted there from;

moving the probe antenna to different positions that are on an elliptical arc around the phased array antenna; and repeating the focusing, measuring and moving steps, wherein said moving step is accomplished by repositioning the probe antenna along different positions on a curve given by $R \cos^2 \Theta$ where $\Theta$ is an angle from broadside to the probe antenna.

* * * * *